(12) United States Patent
Wang

(10) Patent No.: US 11,543,496 B2
(45) Date of Patent: *Jan. 3, 2023

(54) APPARATUS FOR AND METHOD OF RANGE SENSOR BASED ON DIRECT TIME-OF-FLIGHT AND TRIANGULATION

(71) Applicant: Samsung Electronics Co., Ltd., Gyeonggi-do (KR)

(72) Inventor: Yibing Michelle Wang, Temple City, CA (US)

(73) Assignee: Samsung Electronics Co., Ltd.

(*) Notice: Subject to any disclaimer, the term of this patent is extended or adjusted under 35 U.S.C. 154(b) by 647 days.

This patent is subject to a terminal disclaimer.

(21) Appl. No.: 16/450,290

(22) Filed: Jun. 24, 2019

(65) Prior Publication Data
US 2020/0057148 A1 Feb. 20, 2020

Related U.S. Application Data

(63) Continuation-in-part of application No. 14/992,671, filed on Jan. 11, 2016, now Pat. No. 10,942,261.
(Continued)

(51) Int. Cl.
*G01S 7/4861* (2020.01)
*G01S 17/08* (2006.01)
(Continued)

(52) U.S. Cl.
CPC ......... *G01S 7/4861* (2013.01); *G01S 7/4876* (2013.01); *G01S 17/08* (2013.01); *G01S 17/10* (2013.01);
(Continued)

(58) Field of Classification Search
CPC ...... G01S 7/4861; G01S 7/4876; G01S 17/08; G01S 17/10; G06F 1/04; H03K 3/012;
(Continued)

(56) References Cited

U.S. PATENT DOCUMENTS 7,262,402 B2   8/2007  Niclass et al.
7,852,461 B2 * 12/2010  Yahav ................ G01S 17/48
356/3.01
(Continued)

FOREIGN PATENT DOCUMENTS

DE   102004037137    3/2006
EP   2 159 603 A1    1/2008
(Continued)

OTHER PUBLICATIONS

O'Toole et al., "Homogeneous codes for energy-efficient illumination and imaging," Aug. 13, 2015, University of Toronto.
(Continued)

*Primary Examiner* — Luke D Ratcliffe
(74) *Attorney, Agent, or Firm* — The Farrell Law Firm, P.C.

(57) ABSTRACT

A range sensor and a method thereof. The range sensor includes a light source configured to project a plurality of sheets of light at an angle within a field of view (FOV); an image sensor, wherein the image sensor is offset from the light source; collection optics; and a controller connected to the light source, the image sensor, and the collection optics,
(Continued)

and configured to simultaneously determine a range of a distant object based on direct time-of-flight (TOF) and a range of a near object based on triangulation.

18 Claims, 8 Drawing Sheets

Related U.S. Application Data

(60) Provisional application No. 62/244,458, filed on Oct. 21, 2015.

(51) Int. Cl.
| | | |
|---|---|---|
| *G06F 1/04* | (2006.01) | |
| *H03K 3/356* | (2006.01) | |
| *H03K 17/30* | (2006.01) | |
| *H03K 19/00* | (2006.01) | |
| *G01S 7/487* | (2006.01) | |
| *G01S 17/10* | (2020.01) | |
| *H03K 3/012* | (2006.01) | |
| *H03K 3/037* | (2006.01) | |

(52) U.S. Cl.
CPC ............... *G06F 1/04* (2013.01); *H03K 3/012* (2013.01); *H03K 3/0372* (2013.01); *H03K 3/356052* (2013.01); *H03K 17/30* (2013.01); *H03K 19/0016* (2013.01); *H03K 3/356147* (2013.01); *H03K 19/0013* (2013.01)

(58) Field of Classification Search
CPC ........... H03K 3/0372; H03K 3/356052; H03K 17/30; H03K 19/0016; H03K 3/356147; H03K 19/0013
See application file for complete search history.

(56) References Cited

U.S. PATENT DOCUMENTS

| | | |
|---|---|---|
| 8,633,431 B2 | 1/2014 | Kim |
| 8,698,084 B2 | 4/2014 | Jiang et al. |
| 9,006,641 B2 | 4/2015 | Drader |
| 9,082,676 B2 | 7/2015 | Kurokawa |
| 2001/0046317 A1 | 11/2001 | Kamon |
| 2007/0182949 A1 | 8/2007 | Niclass |
| 2014/0078514 A1* | 3/2014 | Zhu .................... G01S 17/10 356/606 |
| 2014/0103196 A1 | 4/2014 | Soga et al. |
| 2014/0347443 A1 | 11/2014 | Cohen et al. |
| 2014/0354539 A1 | 12/2014 | Skogo et al. |
| 2015/0062558 A1 | 3/2015 | Koppal et al. |
| 2015/0168541 A1* | 6/2015 | Lee .................... G01S 17/42 702/159 |
| 2015/0177369 A1 | 6/2015 | Kostamovaara |

FOREIGN PATENT DOCUMENTS

| | | |
|---|---|---|
| EP | 2 159 603 B1 | 1/2008 |
| JP | 2013104784 | 5/2013 |

OTHER PUBLICATIONS

Sgrott et al., "A 134-pixel CMOS sensor for combined time-of-flight and optical triangulation 3-D imaging," 2009 IEEE, pp. 208-211.

Korean Office Action dated Sep. 19, 2022 issued in counterpart application No. 10-2016-0111906, 3 pages.

* cited by examiner

APPARATUS FOR AND METHOD OF RANGE SENSOR BASED ON DIRECT TIME-OF-FLIGHT AND TRIANGULATION

PRIORITY

This Continuation-in-Part Application claims priority under 35 U.S.C. § 120 to U.S. patent application Ser. No. 14/992,671, which was filed in the United States Patent and Trademark Office (USPTO) on Jan. 11, 2016 and claimed priority under 35 U.S.C. § 119(e) to U.S. Provisional Patent Application Ser. No. 62/244,458, which was filed in the USPTO on Oct. 21, 2015, the entire contents of each of which are incorporated herein by reference.

BACKGROUND OF THE DISCLOSURE

Field of the Disclosure

The present disclosure relates generally to an apparatus for and a method of a range sensor, and more particularly, to an apparatus for and a method of a range sensor based on direct time-of-flight (TOF) and triangulation simultaneously.

Description of the Related Art

Three-dimensional (3D) imaging systems are increasingly being used in a wide variety of applications such as, for example, high speed 3D imaging systems for advanced driver assistant systems (ADAS) and high speed 3D imaging systems for autonomous navigation.

Existing 3D imaging technologies may include, for example, the TOF based range imaging, stereo vision systems, and structured light (SL) methods.

In the TOF method, range (or distance) to a 3D object is resolved based on the known speed of light, by measuring the round-trip time it takes for a light signal to travel between a camera and the 3D object for each point of the image. A TOF camera may use a scannerless approach to capture the entire scene with each laser or light pulse. Some example applications of the TOF method may include advanced automotive applications such as active pedestrian safety or pre-crash detection based on distance images in real time, to track movements of humans such as during interaction with games on video game consoles, in industrial machine vision to classify objects and help robots find the items such as items on a conveyor belt, and so on.

In stereoscopic imaging or stereo vision systems, two cameras—displaced horizontally from one another—are used to obtain two differing views on a scene or a 3D object in the scene. By comparing these two images, the relative depth information can be obtained for the 3D object. Stereo vision is highly important in fields such as robotics, to extract information about the relative position of 3D objects in the vicinity of autonomous systems/robots. Other applications for robotics include object recognition, where stereoscopic depth information allows a robotic system to separate occluding image components, which the robot may otherwise not be able to distinguish as two separate objects—such as one object in front of another, partially or fully hiding the other object. 3D stereo displays are also used in entertainment and automated systems.

In the SL approach, the 3D shape of an object may be measured using projected light patterns (e.g., diffraction optical elements (DOE) patterns) and a camera for imaging. In the SL method, a known pattern of light—often grids or horizontal bars or patterns of parallel stripes—is projected onto a scene or a 3D object in the scene. The projected pattern may get deformed or displaced when striking the surface of the 3D object. Such deformation may allow an SL vision system to calculate the depth and surface information of the object. Thus, projecting a narrow band of light onto a 3D surface may produce a line of illumination that may appear distorted from other perspectives than that of the projector, and can be used for geometric reconstruction of the illuminated surface shape. The SL-based 3D imaging may be used in different applications such as, for example, by a police force to photograph fingerprints in a 3D scene, inline inspection of components during a production process, in health care for live measurements of human body shapes or the micro structures of human skin, and the like.

SUMMARY

An aspect of the present disclosure provides an apparatus for and a method of a range sensor based on direct TOF and triangulation.

Another aspect of the present disclosure provides an apparatus for and a method of improved vision for drivers under difficult conditions (e.g., low light, bad weather, strong ambient light, etc.).

Another aspect of the present disclosure provides an apparatus for and a method of improving the performance of an autonomous navigation system.

Another aspect of the present disclosure provides an apparatus for and a method of combining direct TOF with triangulation in one image sensor, where TOF is used for distant objects and triangulation is user for near objects.

Another aspect of the present disclosure provides an apparatus for and a method of using range gating to ignore certain ranges.

Another aspect of the present disclosure provides an apparatus for and a method of using a single photon avalanche diode (SPAD) array in both an avalanche mode and a linear mode to reduce power consumption and substrate-induced interference.

In accordance with an aspect of the present disclosure, a range sensor is provided. The range sensor includes a light source configured to project a plurality of sheets of light at an angle within a field of view (FOV); an image sensor, wherein the image sensor is offset from the light source; collection optics; and a controller connected to the light source, the image sensor, and the collection optics, and configured to simultaneously determine a range of a distant object based on direct TOF and a range of a near object based on triangulation.

In accordance with another aspect of the present disclosure, a method of a range sensor is provided. The method includes projecting, by a light source, a plurality of sheets of light at an angle within an FOV; offsetting an image sensor from the light source; collecting, by collection optics, the plurality of sheets of light reflected off objects; and determining simultaneously, by a controller connected to the light source, the image sensor, and the collection optics, a range of a distant object based on direct time-of-flight and a range of a near object based on triangulation.

In accordance with another aspect of the present disclosure, a range sensor is provided. The range sensor includes a light source configured to project a plurality of sheets of light at an angle within an FOV; an image sensor, wherein the image sensor is offset from the light source; collection optics; and a controller connected to the light source, the image sensor, and the collection optics, and configured to simultaneously determine a range of a distant object based on direct time-of-flight and determine a range of a near object based on triangulation, wherein simultaneously determining the range of the distant object is based at least in part on a path of each of the plurality of sheets of light from the light source to the distant object and the time elapsed as each of the plurality of sheets of light travels the path.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
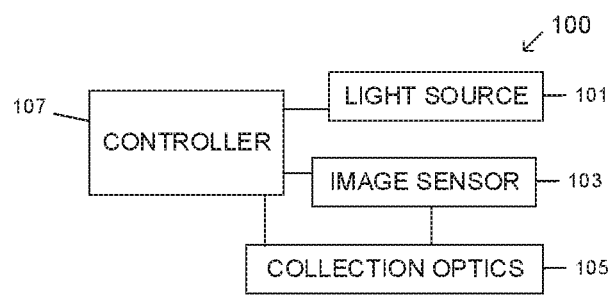
FIG. 1 is a block diagram of a range sensor according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of additional one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

FIG. 1 is a block diagram of a range sensor 100 according to an embodiment of the present disclosure.

Referring to FIG. 1, the range sensor 100 includes a light source 101, an image sensor 103, collection optics 105, and a controller 107.

In an embodiment of the present disclosure, the light source 100 projects a sheet of light in a predetermined angle within an FOV. The sheet of light may be horizontal. However, the present disclosure is not limited thereto. Other orientations of the sheet of light may be used in an embodiment of the present disclosure (e.g., vertical or at a predetermined angle). The sheet of light may be a sheet of laser light projected in one pulse. However, the present disclosure is not limited thereto. Any other form of light that can image near and distant objects may be used. To illuminate more of the FOV, the light source 100 may project at least one additional sheet of light within another predetermined angle of the FOV (e.g., at the same angle but in a different section of the FOV, a different angle, a different angle in a different section of the FOV, etc.). The operation of the range sensor 100 is described below in more detail with reference to FIGS. 6 and 7. In an embodiment, the light source 100 may project a plurality of sheets of light at an angle within an FOV.

Distant objects are objects in the range of 30 meters (30 m) to 250 m, and near objects are within 30 m. However, the present disclosure is not limited thereto, and any other suitable ranges for distant and near objects may be used.

The image sensor 103 is placed at an offset from the light source 101. For example, the image sensor 103 may be placed at a vertical offset from the light source 101 in the range of from 0.01 m to 0.5 m. However, the present disclosure is not limited to a vertical offset or an offset in the range of 0.01 m to 0.5 m. Other orientations and ranges of offsets may be used in an embodiment of the present disclosure. The image sensor 103 is described below in greater detail with reference to FIGS. 2A and 2B. In an embodiment, the image sensor 103 may reject ambient light.

The collection optics 105 is positioned with respect to the image sensor 103 to collect light from at least the light source 101 that reflects off distant and near objects and to project such light onto the image sensor 103. In an embodiment of the present disclosure, the collection optics 105 may be a lens positioned in front of the image sensor 103. However, the present disclosure is not limited to the collection optics 105 being a lens or being positioned in front of the image sensor 103 (e.g., the collection optics 105 may be at a predetermined angle with respect to the image sensor 103). The collection optics 105 may be a focusing lens or a glass/plastics surface that concentrates reflected light received from an illuminated object onto the image sensor 103. In an embodiment of the present disclosure, a convex structure may be used as a focusing lens. However, any other suitable lens design may be selected for the collection optics 105.

The controller 107 is connected to the light source 101, the image sensor 103, and the collection optics 105 to control the operation of the light source 101 (e.g., control when the light source projects a sheet of light, the angle at which the sheet of light is projected, the number and angle of additional sheets of light projected, etc.), the image sensor 103, and the collection optics 105 (e.g., control the angle of collection, etc.).

Figure 2A:
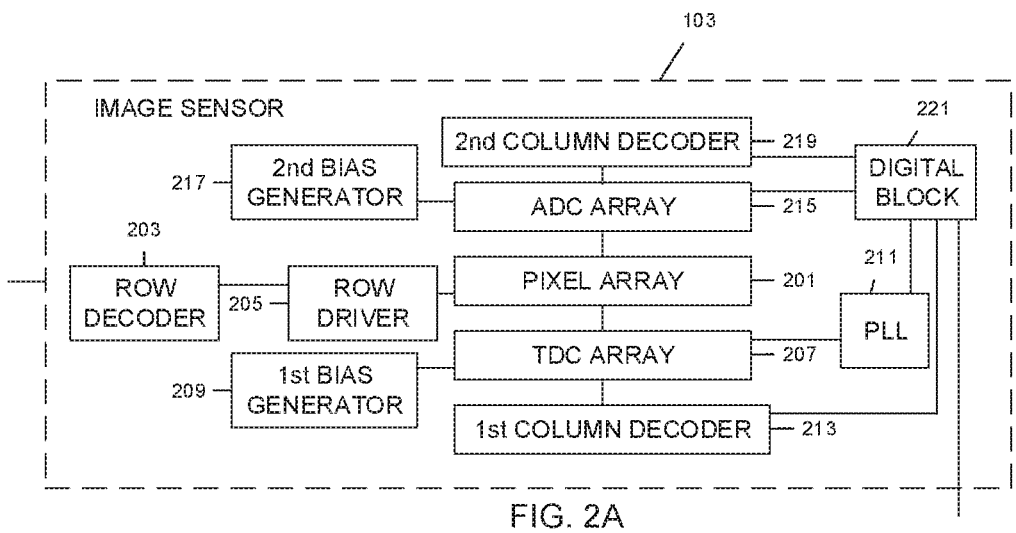
FIG. 2A is a block diagram of an image sensor of FIG. 1 according to an embodiment of the present disclosure.

FIG. 2A is a block diagram of the image sensor 103 of FIG. 1, according to an embodiment of the present disclosure.

Referring to FIG. 2A, the image sensor 103 includes a pixel array 201, a row decoder 203, a row driver 205, a time-to-digital converter (TDC) array 207, a first bias generator 209, a phase-locked-loop (PLL) 211, a first column decoder 213, an analog-to-digital converter (ADC) array 215, a second bias generator 217, a second column decoder 219, and a digital block 221.

In an embodiment of the present disclosure, the pixel array 201 includes a plurality of pixel cells arranged in rows and columns for collecting light incident on the image sensor 103 (e.g., light from the light source 101 that reflects off distant and near objects). The pixel array 201 is described below in more detail with reference to FIGS. 3-5. The pixel array 201 includes an input for selecting one of several rows of the pixel array 201, a first output for outputting pixel data concerning distant objects, and a second output for outputting pixel data concerning near objects.

Distant objects are imaged on the same row, which is referred to as an "infinity row." Some of the rows are invalid based on triangulation theory, for example, if the light source is above the sensor, the rows above the infinity row are invalid. Any signal generated on the invalid rows are caused by scatters, multipath reflection, and glare etc., but not the image of the projected light. The rest of the rows below the infinity row image the near objects. The closer the row is to the infinity row, the farther the imaged object is. Some of the rows concerning near objects may be disabled, which is referred to as "range gating," where pixel data concerning the disabled rows are not processed for determining a range of a near object. By doing so, the frame rate of the readout out is increased. All the valid rows can also be gated in time based on its own TOF. As a result, ranging accuracy is improved, because false signals caused by a difficult condition (e.g., multipath reflection, low light/visibility, bad weather such as rain and fog, strong ambient light/glare, etc.) may be removed by disabling the row beyond its TOF range.

The row decoder 203 receives a signal from the controller 107 indicating which row of the pixel array 201 is selected, and outputs a signal for selecting the indicated row.

The row driver 205 includes an input connected to the output of the row decoder 203 and an output connected to the input of the pixel array 201 for providing signals and voltage levels necessary to select the indicated row (e.g., a row select signal (RSEL), a reset signal (RST), a transfer signal (TX), and a power supply voltage for the pixel cell of FIG. 4 described below, and RSEL, RST, a quench signal (Vquench), and a power supply voltage (VAPD) for the pixel cell of FIG. 5 described below.

The TDC array 207 includes a first input connected to the first output of the pixel array 201 for receiving pixel data concerning distant objects, a second input for receiving a bias voltage, a third input for receiving a periodic signal from the PLL 211, and an output connected to the input of the first column decoder 213. The TDC array 207 converts pixel data from the pixel array 201 concerning distant objects to digital codes representing TOF of the associated pixel data.

The first bias generator 209 provides a voltage level to the TDC array 207.

The PLL 211 provides a periodic signal to the TDC array 207 to enable the TDC array 207 to measure and output TOF data.

The first column decoder 213 receives the output from the TDC array 207 for a column indicated by the controller 107 and outputs the result. In an embodiment of the present disclosure, the TDC array 207 may also be used as the ADC array 215. After a TOF signal is measured, the TDC array 207 may be used as an ADC array to read near field data.

The ADC array 215 includes a first input connected to the second output of the pixel array 201 for receiving pixel data concerning near objects, a second input for receiving a bias voltage, and a first and second output for outputting pixel data for near objects from rows of the pixel array 201 indicated by the controller 107.

The second bias generator 217 provides a voltage level to the ADC array 215.

The second column decoder 219 receives the output from the ADC array 215 for a column indicated by the controller 107 and outputs the result.

The digital block 221, receives the output of the first column decoder 213, the PLL 211, the ADC array 215, and the second column decoder 219 and calculates range information based on TOF for distant objects and calculates range information based on triangulation for near objects.

Figure 2B:
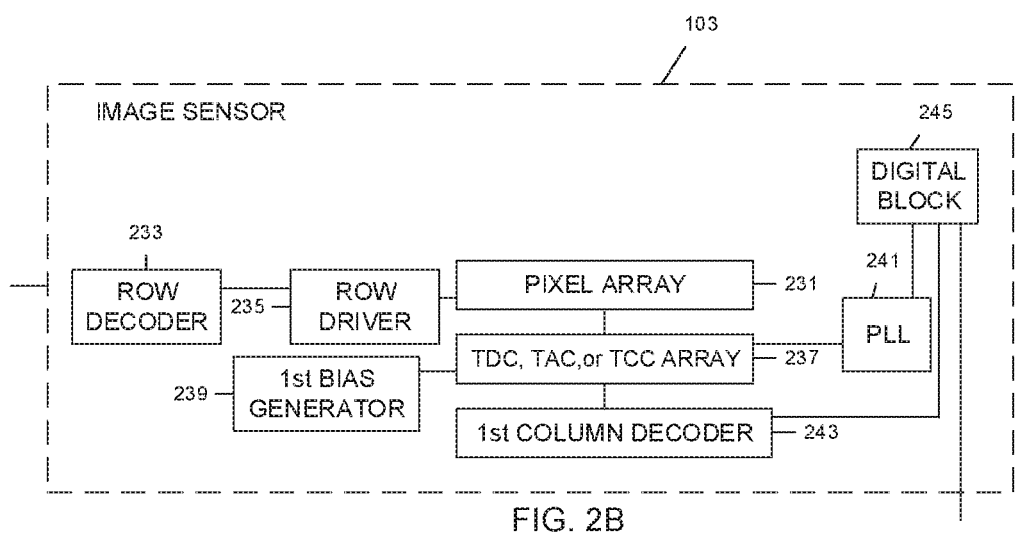
FIG. 2B is a block diagram of an image sensor of FIG. 1 according to an embodiment of the present disclosure.

FIG. 2B is a block diagram of the image sensor 103 of FIG. 1, according to an embodiment of the present disclosure.

Referring to FIG. 2B, the image sensor 103 includes a pixel array 231, a row decoder 233, a row driver 235, one of a TDC array, a time-to-analog converter (TAC) array, and a time-to-charge converter (TCC) 237, a first bias generator 239, a phase-locked-loop (PLL) 241, a first column decoder 243, and a digital block 245.

In an embodiment of the present disclosure, the pixel array 231 includes a plurality of pixel cells arranged in rows and columns for collecting light incident on the image sensor 103 (e.g., light from the light source 101 that reflects off distant and near objects). The pixel array 231 is described below in more detail with reference to FIGS. 3-5. The pixel array 231 includes an input for selecting one of several rows of the pixel array 231, a first output for outputting pixel data concerning distant objects, and a second output for outputting pixel data concerning near objects.

Distant objects are imaged on the same row, which is referred to as an "infinity row." Some of the rows are invalid based on triangulation theory, for example, if the light source is above the sensor, the rows above the infinity row are invalid. Any signal generated on the invalid rows are caused by scatters, multipath reflection, and glare etc., but not the image of the projected light. The rest of the rows below the infinity row image the near objects. The closer the row is to the infinity row, the farther the imaged object is. Some of the rows concerning near objects may be disabled, which is referred to as "range gating," where pixel data concerning the disabled rows are not processed for determining a range of a near object. By doing so, the frame rate of the readout out is increased. All the valid rows can also be gated in time based on its own TOF. As a result, ranging accuracy is improved, because false signals caused by a difficult condition (e.g., multipath reflection, low light/visibility, bad weather such as rain and fog, strong ambient light/glare, etc.) may be removed by disabling the row beyond its TOF range.

The row decoder 233 receives a signal from the controller 107 indicating which row of the pixel array 231 is selected, and outputs a signal for selecting the indicated row.

The row driver 235 includes an input connected to the output of the row decoder 233 and an output connected to the input of the pixel array 231 for providing signals and voltage levels necessary to select the indicated row (e.g., a row select signal (RSEL), a reset signal (RST), a transfer signal (TX), and a power supply voltage for the pixel cell of FIG. 4 described below, and RSEL, RST, a quench signal (Vquench), and a power supply voltage (VAPD) for the pixel cell of FIG. 5 described below.

The one of the TDC array, the TAC array, and the TCC array 237 includes a first input connected to the first output of the pixel array 231 for receiving pixel data concerning distant objects, a second input for receiving a bias voltage, a third input for receiving a periodic signal from the PLL 241, and an output connected to the input of the first column decoder 243. The one of the TDC array, the TAC array, and the TCC array 237 converts pixel data from the pixel array 231 concerning distant objects to digital codes representing TOF of the associated pixel data.

The first bias generator 239 provides a voltage level to one of the TDC array, the TAC array, and the TCC array 237.

The PLL 241 provides a periodic signal to one of the TDC array, the TAC array, and the TCC array 237 to enable one of the TDC array, the TAC array, and the TCC array 237 to measure and output TOF data.

The first column decoder 243 receives the output from one of the TDC array, the TAC array, and the TCC array 237 for a column indicated by the controller 107 and outputs the result.

The digital block 245, receives the output of the first column decoder 243, the PLL 241, and calculates range information based on TOF for distant objects and calculates range information based on triangulation for near objects.

Figure 3:
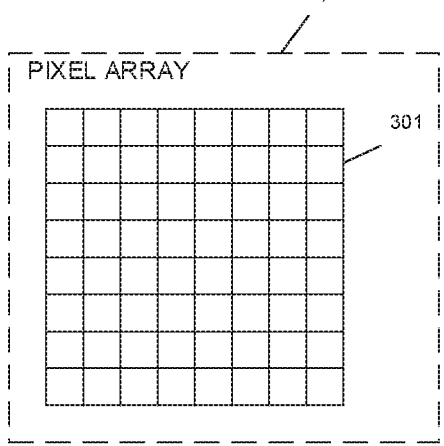
FIG. 3 is an illustration of a pixel array of the image sensor of FIGS. 2A and 2B according to an embodiment of the present disclosure.

FIG. 3 is an illustration of the pixel array 201 of the image sensor 103 of FIG. 2A and the pixel array 231 of the image sensor 103 of FIG. 2B according to an embodiment of the present disclosure.

Referring to FIG. 3, the pixel array 201 and 231 includes a plurality of pixel cells 301 arranged in n columns and m rows, where n and m are each pre-determined integers. For ranging based on triangulation (e.g., ranging of near objects), the pitch of the pixel cells 301 determines the ranging resolution. The smaller the pixel pitch the greater the ranging resolution based on triangulation. For example, the pitch of the pixel cells may be in the range of 1 micron to 10 microns. However, the present disclosure is not limited to this range of pixel pitches, and any other suitable pixel pitch may be used. The information contained in multiple pixel cells 301 may be binned. Binning increases sensitivity with respect to light reflected off distance objects. Two types of the pixel cell 301 are described below with reference to FIGS. 4 and 5. However, the present disclosure is not limited to these two types of pixel cells 301. In an embodiment of the present disclosure, the pixel array 201 and 231 may be a complementary metal oxide semiconductor (CMOS) array.

The light received from an illuminated object may be focused onto one or more pixel cells 301 of the pixel array 201 and 231 via the collection optics 105 of the range sensor 100. The pixel array 201 and 231 may be an RGB pixel array, in which different pixel cells 301 may collect light signals of different colors. The pixel array 201 and 231 may be any 2D sensor such as, for example, a two dimensional (2D) red-green-blue (RGB) sensor with an infrared (IR) cut filter, a 2D IR sensor, a 2D near IR (NIR) sensor, a 2D red-green-blue-white (RGBW) sensor, a 2D RGB-IR sensor, and the like. The pixel array 201 may be used for 2D RGB color imaging of an object (or a scene containing an object) as well as for three dimensional (3D) imaging involving depth measurement of an object.

Figure 4:
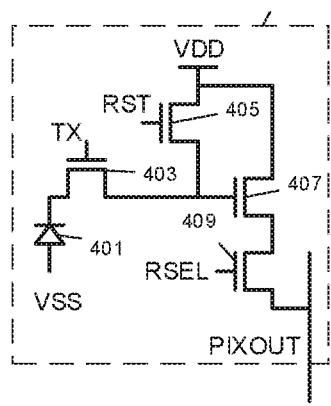
FIG. 4 is a schematic drawing of a pixel cell of the pixel array of FIG. 3 according to an embodiment of the present disclosure.

FIG. 4 is a schematic drawing of a pixel cell 301 of the pixel array 201 of FIG. 3 according to an embodiment of the present disclosure.

Referring to FIG. 4, each pixel cell 301 may be a four transistor pinned photodiode (4T PPD) pixel cell that includes a pinned photo-diode (PPD) 401 and first to fourth n-channel metal oxide semiconductor (NMOS) field effect transistors (FETs) 403, 405, 407, and 409. However, the present disclosure is not limited to a 4T PPD. Other types of pixel cells may be used as the pixel cell 301, such as a three transistor (3T) pixel, which omits the first NMOS transistor 403 of the 4T PPD. In addition, a one transistor (1T) pixel or a two transistor (2T) pixel may be used as the pixel cell 301. Furthermore, the pixel cell 301 may have a shared-transistor pixel configuration, where transistors and readout circuitry can be shared among two or more neighboring pixel cells 301. In a shared-transistor pixel configuration, each pixel cell 301 may have at least one photo-diode and one transfer-gate transistor, where the other transistors can be shared among two or more pixels cells 301. A shared transistor pixel cell may be a 2-shared (1×2) 2.5 transistor pixel cell where five transistors are used for two pixels cells, resulting in a 2.5 transistors/pixel cell. In addition, a shared-transistor pixel cell may be used. For example, a 1×4 4-shared pixel cell, in which 4 pixels cells share the readout circuitry may be used, where each pixel cell has at least one photo-diode and one transfer-gate transistor.

The PPD 401 includes an anode connected to a ground potential (0 volts) or less (e.g., VSS) and a cathode. The PPD 401 converts photons incident on the PPD 401 into electrons, thereby converting an optical input signal into an electrical signal in the charge domain. The PPD 401 may operate in an avalanche photo-diode (APD) mode and logarithm mode for both distant and near objects. Then, one of the TDC array, the TAC array, and the TCC array 237 in FIG. 2B records TOF information. The TOF information may be cross-validated with corresponding disparity information for the same one of the plurality of sheets of light. That is, a long TOF is validated by disparity information that indicates a distant object, a short TOF is validated by disparity information that indicates a near object, a long TOF is not validated by disparity information that indicates a near object, and a short TOF is not validated by disparity information that indicates a distant object.

The first NMOS transistor 403 includes a source terminal connected to the cathode of the PPD 401, a gate terminal for receiving a transfer signal (TX), and a drain terminal connected to a source terminal of the second NMOS transistor 405 and a gate terminal of the third NMOS transistor 407. The first NMOS transistor 403 is turned on to transfer the photon-generated electrons from the PPD 401 to the second terminal of the first NMOS transistor 403.

The second NMOS transistor 405 includes a drain terminal connected to a power supply voltage (e.g., VDD) and a drain terminal of the third NMOS transistor 407, a gate terminal for receiving a reset signal (RST), and a source terminal connected to the drain terminal of the first NMOS transistor 403 and the gate terminal of the third NMOS transistor 407. The RST signal resets the PPD 401 to a pre-determined high voltage level (e.g., logic level 1 voltage) when RST and TX are each a high voltage level to turn on the second NMOS transistor 405 and the first NMOS transistor 403, respectively.

The third NMOS transistor 407 includes a drain terminal connected to a power supply voltage (e.g., VDD) and the drain terminal of the drain terminal of the second NMOS transistor 405, a gate terminal connected to the drain terminal of the first NMOS transistor 403 and the source terminal of the second NMOS transistor 405, and a source terminal connected to a drain terminal of the fourth NMOS transistor 409.

The fourth NMOS transistor 409 includes a drain terminal connected to the source terminal of the third NMOS transistor 407, a gate terminal for receiving a row select signal (RSEL), and a source terminal connected to the pixel output (PIXOUT) of the pixel cell 301. The RSEL signal transfers the voltage corresponding to the optical signal incident on the PPD 401 when RSEL is a high voltage level and RST is a low voltage level to turn on the fourth NMOS transistor 409 and turn off the second NMOS transistor 405, respectively.

The pixel cell 301 of FIG. 4 can operate in a non-integrating logarithmic mode when both TX and RST are high voltages (e.g., logic level 1 voltages) and an integrating linear mode when TX and RST are each a low voltage (e.g., logic level 0 voltages). Pixel cells 301 that receive light reflected off distant objects are operated in logarithmic mode to detect low levels of light. Pixel cells 301 that receive light reflected off near objects are operated in linear mode to detect higher levels of light. Pixel cells 301 that are disabled due to range gating are reset.

Figure 5:
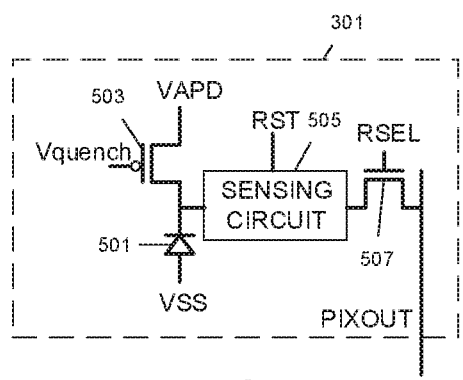
FIG. 5 is a schematic drawing of a pixel cell of the pixel array of FIG. 3 according to an embodiment of the present disclosure.

FIG. 5 is a schematic drawing of a pixel cell 301 of the pixel array 201 of FIG. 3 according to an embodiment of the present disclosure;

Referring to FIG. 5, each pixel cell 301 may include a photo-diode (PD) 501, a p-channel MOS (PMOS) transistor 503, a sensing circuit 505, and an NMOS transistor 507.

The PD 501 includes an anode connected to a ground potential and a cathode. The PPD 501 is an avalanche diode that has a breakdown voltage (VBD). A SPAD pixel includes a germanium-on-silicon avalanche photodiode (Ge-on-Si APD).

The PMOS transistor 503 includes a source terminal connected a power supply voltage (VAPD), a gate terminal for receiving a quench voltage (Vquench), and a drain terminal connected to the cathode of the PD 501 and an input of the sensing circuit 505. The PMOS transistor 503 is turned on to supply a voltage (VAPD) to the cathode of the PD 501. When VAPD below VBD is supplied to the PD 501, the PD 501 operates in a linear mode. When VAPD greater than VBD is supplied to the PD 501, the PD 501 operates in avalanche mode (e.g., Geiger mode) to increase sensitivity to light reflected off an object. In linear mode, pixel current and substrate-induced interference is reduced.

The sensing circuit 505 includes a first input connected to the cathode of the PD 501 and the drain terminal of the PMOS transistor 503, a second input for receiving a reset signal (RST), and an output connected to a drain terminal of the NMOS transistor 507. The RST signal resets the PD 501 to a pre-determined high voltage level.

The NMOS transistor 507 includes a drain terminal connected to the output of the sensing circuit 505, a gate terminal for receiving a row select signal (RSEL), and a source terminal connected to the pixel output (PIXOUT) of the pixel cell 301. The RSEL signal transfers the voltage corresponding to the optical signal incident on the PD 501 when RSEL is a high voltage level.

Pixel cells 301 that receive light reflected off distant objects are operated in Geiger mode to detect low levels of light, and the pixel cells 301 are reset after a photon is detected. Pixel cells 301 that receive light reflected off near objects are operated in either the Geiger mode to increase sensitivity or the linear mode to reduce power consumption and substrate-induced interference, where the pixel cells 301 are not reset until the pixel cells are read out to PIXOUT.

Figure 6:
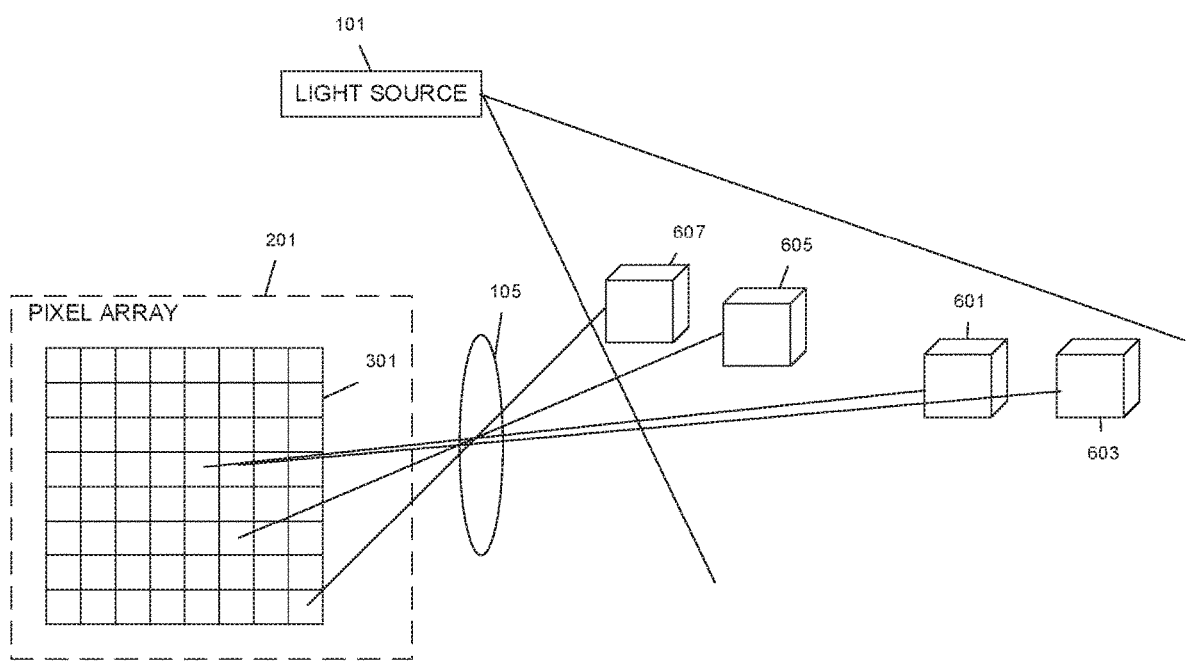
FIG. 6 is an illustration of imaging distant and near objects on the pixel array of FIG. 3 according to an embodiment of the present disclosure.

FIG. 6 is an illustration of imaging distant objects 601 and 603 and near objects 605 and 607 on the pixel array 201 and 231 of FIG. 3 according to an embodiment of the present disclosure.

Referring to FIG. 6, the light source 101 of the range sensor 100 projects, in one pulse, a sheet of light (e.g., a horizontal sheet of laser light) in a predetermined angle θ of the FOV. The sheet of light reflects off the near objects 605 and 607 and the distant objects 601 and 603 in the angle θ of the FOV and is collected by the collection optics 105 and focused onto the pixel cells 301 of the pixel array 201 and 231. In an embodiment, a plurality of sheets of light may be projected.

The distant objects 601 and 603 in the angle θ of the FOV are imaged onto the same row (e.g., an infinity row) of pixel cells 301 in the pixel array 201. The range (or distance) of a distant object (e.g., 601 or 603) from the range sensor 100 is measured using the direct TOF of the sheet of light from the light source 101 to the distant object (e.g., 601 or 603) and from the distant object (e.g., 601 or 603) to the pixel array 201 and 231. Imaging using direct TOF is described below in greater detail with reference to FIG. 7.

The near objects 605 and 607 in the angle θ of the FOV are imaged onto rows other than the infinity row of pixel cells 301 in the pixel array 201 and 231. The range (or distance) of a near object (e.g., 605 or 607) from the range sensor 100 is measured using triangulation. Imaging using triangulation is described below in greater detail with reference to FIG. 7.

Distant objects are imaged on the same row, which is referred to as an "infinity row." Some of the rows are invalid based on triangulation theory, for example, if the light source is above the sensor, the rows above the infinity row are invalid. Any signal generated on the invalid rows are caused by scatters, multipath reflection, and glare etc., but not the image of the projected light. The rest of the rows below the infinity row image the near objects. The closer the row is to the infinity row, the farther the imaged object is. Some of the rows concerning near objects may be disabled, which is referred to as "range gating," where pixel data concerning the disabled rows are not processed for determining a range of a near object. By doing so, the frame rate of the readout is increased. All the valid rows can also be gated in time based on its own TOF. As a result, ranging accuracy is improved, because false signals caused by a difficult condition (e.g., multipath reflection, low light/visibility, bad weather such as rain and fog, strong ambient light/glare, etc.) may be removed by disabling the row beyond its TOF range. In addition, TOF information may be cross-validated against corresponding disparity information as described above.

To image additional sections of the FOV, at least one additional projection of a sheet of light is made, where the same angle θ may be used but at a different position, a new angle θ is used at the same position, a new angle θ and at new position is used, etc.

Figure 7:
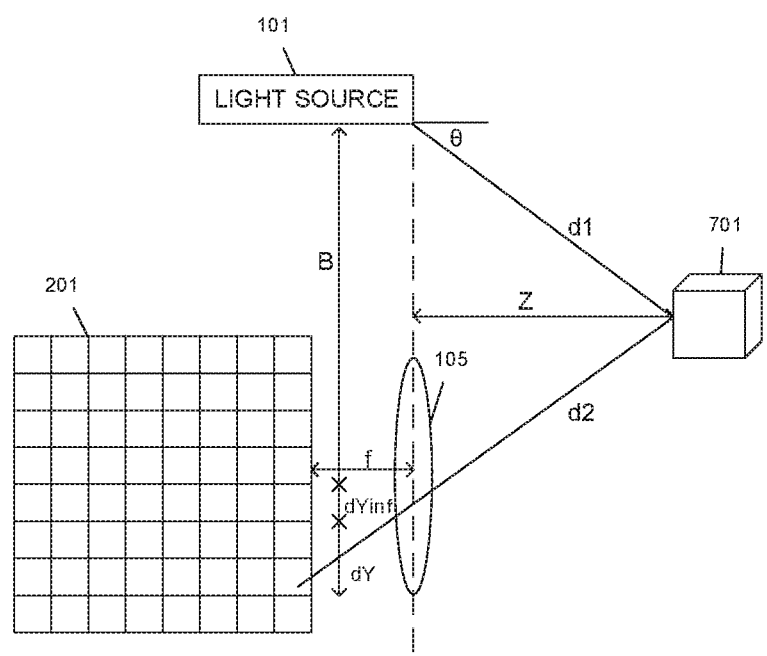
FIG. 7 is an illustration of determining a range to an object according to an embodiment of the present disclosure.

FIG. 7 is an illustration of determining a range to an object according to an embodiment of the present disclosure.

Referring to FIG. 7, if the object 701 is a distant object, the sheet of light projected from the light source 101 of the range sensor 100 reflects off the distant object 701, is collected by the collection optics 105, and is focused onto the infinity row of the pixel array 201, where the infinity row may be one row or multiple rows for binning. The range Z to the distant object 701 is determined by the direct TOF of the sheet of light from the light source 101 along the path d1 to the distant object 701 and from the distant object 701 along path d2 to the infinity row of the pixel array 201, according to Equation (1) as follows:

$$Z = \frac{d1 + d2}{2} = \frac{c \times (t1 + t2)}{2}, \quad (1)$$

where d1 is the path of the sheet of light from the light source 101 to the distant object 701 (e.g., the projection path), d2 is the path of the sheet of light reflecting off the distant object 701 to the infinity row of the pixel array 201 of the image sensor 103 (e.g., the return path), c is the speed of light, t1 is the time that it takes for the sheet of light to go from the light source 101 to the distant object 701 (e.g., the projection time), and t2 is the time that it takes for the sheet of light to go from the distant object 701 to the infinity row of the pixel array 201 of the image sensor 103 (e.g., the return time).

If the object 701 is a near object, the sheet of light projected from the light source 101 of the range sensor 100 reflects off the near object 701, is collected by the collection optics 105, and is focused onto a row other than the infinity row of the pixel array 201. If the row is not ignored due to range gating, the range (or distance) Z to the near object 701 is determined by triangulation according to Equation (2) as follows:

$$Z = \frac{fB}{dY_{inf} + dY + f\tan(\theta)}, \quad (2)$$

where f is the focal length from the collection optics 105 to the pixel array 201 of the image sensor 103, B is the offset between the light source 101 and the center row of the pixel array 201 of the image sensor, $dY_{inf}$ is the displacement of the infinity row from the center row of the pixel array 201 of the image sensor, dY is the displacement of a row (e.g., the imaging row) other than the infinity row from the infinity row of the pixel array of the image sensor 103, tan( ) is the tangent function, and θ is the angle of the sheet of light projected from the light source 101. For example, the focal length may be 10 mm. However, the present disclosure is not limited to this focal length, and any suitable focal length may be used.

Figure 8A:
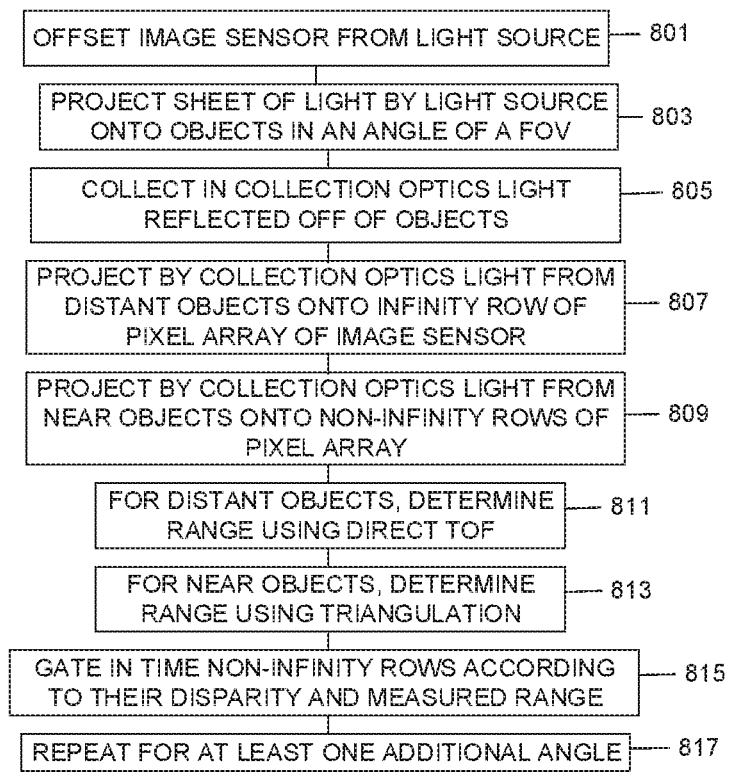
FIG. 8A is a flowchart of a method of a range sensor according to an embodiment of the present disclosure.

FIG. 8A is a flowchart of a method of a range sensor 100 according to an embodiment of the present disclosure.

Referring to FIG. 8A, an image sensor 103 is offset from the light source 101 in step 801. For example, the image sensor 103 may be placed at a vertical offset from the light source 101 in the range of 0.01 m to 0.5 m. However, the present disclosure is not limited to a vertical offset or an offset in the range of 0.01 m to 0.5 m. Other orientations and ranges of offsets may be used in an embodiment of the present disclosure. The image sensor 103 has been described in greater detail with reference to FIGS. 2A and 2B.

In step 803, light is projected from a light source in a sheet of light at a predetermined angle θ within an FOV. In an embodiment of the present disclosure, the light may be laser light projected in one pulse. However, the present disclosure is not limited thereto, and any other type of light that can image near and distant objects may be used. In an embodiment of the present disclosure, the sheet of light may be horizontal. However, the present disclosure is not limited to a horizontal sheet of light. The light may be a horizontal point of light. The light may also be a vertical sheet of light or a vertical point of light. If an image sensor is vertical then sheet of light will be vertical. The sheet of light or the scan line of the light should be parallel to the row of the pixel array 201. In addition, the displacement of the light source and an image sensor should be perpendicular to a row of the pixels array. To illuminate more of the FOV, at least one additional sheet of light may be projected by the light source within another predetermined angle within the FOV (e.g., at the same angle but in a different section of the FOV, at a different angle, at a different angle and a different section of the FOV, etc.).

In step 805, light is collected in collection optics 105 from at least the light source 101 that reflects off distant and near objects.

In step 807, the collected light from distant objects is projected onto an infinity row of the pixel array 201 of the image sensor 103. The infinity row outputs are connecting to the TDC array. The time of flight of the distant objects are measured and recorded by the TDC.

In step 809, the collected light from near objects is projected onto non-infinity rows of the pixel array 201 of the image sensor 103. Steps 807 and 809 occur simultaneously. The non-infinity rows are in integration mode and are connected to the ADC array one after the other for readout after integration is completed.

In an embodiment of the present disclosure, additional sections of the FOV are imaged by projecting at least one additional sheet of light, where the same angle θ may be used but at a different position, a new angle θ is used at the same position, a new angle θ and at new position is used, etc., collecting the at least one additional sheet of light that reflects off distant and near objects, and projecting the collected light onto the image sensor 103.

In an embodiment of the present disclosure, the pixel array information contained in multiple pixel cells 301 may be binned. To increase sensitivity, the infinity row may include multiple rows. The non-infinity rows are independent to have high depth resolution for near objects.

In an embodiment of the present disclosure, the pixel cell 301 on the infinity row operates in a non-integrating logarithmic mode and connects to a TDC to detect the time-of-flight from distant objects and operates in an integrating linear mode to detect the disparity of light reflected off near objects from the infinity row.

In an embodiment of the present disclosure, the pixel cell 301 operates in avalanche mode (e.g., Geiger mode) to detect time-of-flight of light reflected off distant objects and operates in either the Geiger mode or a linear mode to detect disparity of light reflected off near objects, and to reduce power consumption and substrate-induced interference.

In step 811, if a pixel cell 301 in the pixel array 201 concerns a distant object, the range Z to the distant object is determined by direct TOF according to Equation (1) described above. A distant object is one which is imaged on a single or a binned infinity row. The distance range is not absolutely infinity. Based on triangulation, the distance of an object which is imaged onto the row right below the infinity row may be calculated. The infinity row's range is any distance greater than an object imaged onto the row right below the infinity row. Based on the distance range, gating in time is done for the infinity row to further filter out a noise signal caused by multipath reflection, bad weather, etc. Time gating indicates that the pixels in the infinity row of the pixel array 201 are enabled with a time delay after the light source 101 is pulsed. The time delay is related to the time of flight of the minimum distance range the infinity row is able to capture. The duration of the gating signal is determined by the time-of-flight of the largest range to be measured.

In step 813, if a pixel cell 301 in the pixel array 201 concerns a near object, the range Z to the near object is determined by triangulation according to Equation (2) described above. Time gating may also be applied to a near object. An integration time may be shorter than the TOF of the infinity row or may be the same as the duration of the light pulse. In an embodiment of the present disclosure, after integration is completed, the non-infinity rows are connected to the ADC one after the other for readout. The bright spots on each row is used to determine disparity of the reflected light and then the range of the near objects.

In step 815, non-infinity rows are gated in time according to their disparity and measured range. Rows other than the infinity row that include disparity (e.g., light affected by multipath reflection, low light/visibility, bad weather such as rain and fog, strong ambient light/glare, etc.) are in integration mode when the light source 101 is pulsed. If the light source 101 is above the image sensor 103, the rows above the infinity row of the pixel array 201 are considered invalid rows. A signal received on an invalid row may be caused by a multipath reflection or by a light source other than the light source 101. The invalid rows should be disabled or not read during the read out time. The rows below the infinity row which are non-infinity rows are used to integrate valid signals from near objects. Depending on the distance of interest, certain rows may be selected to read out, which is referred to as range gating.

In step 817, steps 801 to 815 are repeated for at least one additional angle θ within the FOV.

Figure 8B:
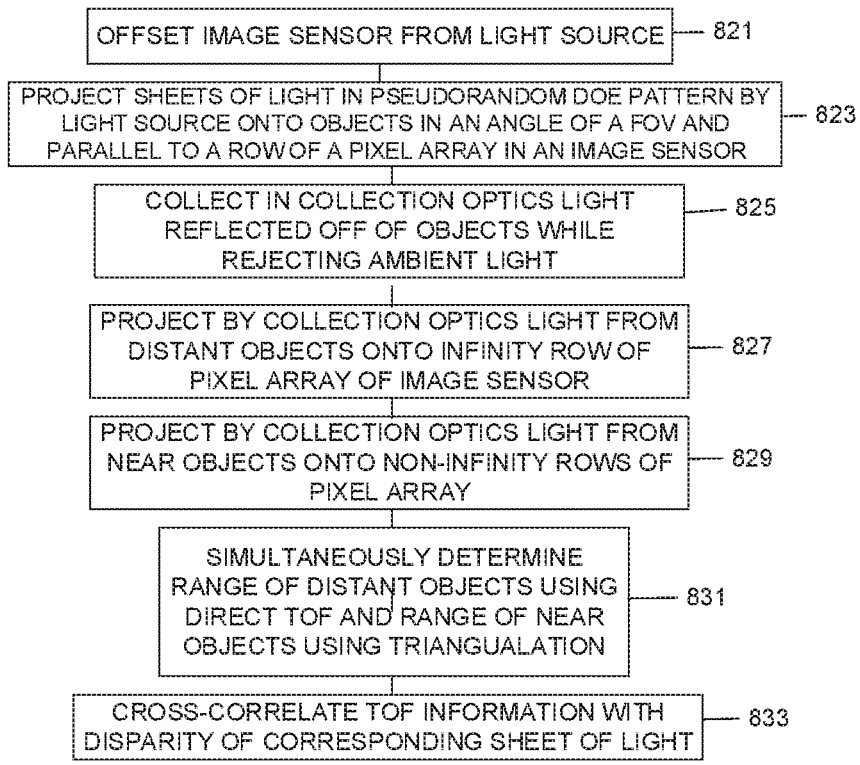
FIG. 8B is a flowchart of a method of a range sensor according to an embodiment of the present disclosure.

FIG. 8B is a flowchart of a method of a range sensor 100 according to an embodiment of the present disclosure.

Referring to FIG. 8B, an image sensor 103 is offset from the light source 101 in step 821. For example, the image sensor 103 may be placed at a vertical offset from the light source 101 in the range of 0.01 m to 0.5 m. However, the present disclosure is not limited to a vertical offset or an offset in the range of 0.01 m to 0.5 m. Other orientations and ranges of offsets may be used in an embodiment of the present disclosure. The image sensor 103 has been described in greater detail with reference to FIGS. 2A and 2B.

In step 823, a plurality of sheets of light are projected from a light source in a pseudorandom DOE pattern at a predetermined angle θ within an FOV. In an embodiment of the present disclosure, each sheet of light may be laser light projected in one pulse. However, the present disclosure is not limited thereto, and any other type of light that can image near and distant objects may be used. In an embodiment of the present disclosure, each sheet of light may be parallel to a row of a pixel array in an image sensor. In addition, each sheet of light may be a horizontal sheet of light. Furthermore, each sheet of light may be a horizontal point of light. Moreover, each sheet of light may be a vertical sheet of light or a vertical point of light. If an image sensor is vertical then each sheet of light may be vertical. Each sheet of light or a scan line of each sheet of light may be parallel to a row of the pixel array 231. In addition, the displacement of the light source and an image sensor may be perpendicular to a row of the pixel array 231. To illuminate more of the FOV, at least one additional sheet of light may be projected by the light source within another predetermined angle within the FOV (e.g., at the same angle but in a different section of the FOV, at a different angle, at a different angle and a different section of the FOV, etc.).

In step 825, light is collected in collection optics 105 from at least the light source 101 that reflects off distant and near objects and ambient light is rejected.

In step 827, the collected light from distant objects is projected onto an infinity row of the pixel array 231 of the image sensor 103. The infinity row outputs are connecting to one of the TDC array, the TAC array, and the TCC array 237. The time of flight of the distant objects are measured and recorded by one of the TDC array, the TAC array, and the TCC array 237.

In step 829, the collected light from near objects is projected onto non-infinity rows of the pixel array 231 of the image sensor 103. Steps 827 and 829 occur simultaneously.

In an embodiment of the present disclosure, additional sections of the FOV are imaged by projecting at least one additional sheet of light, where the same angle θ may be used but at a different position, a new angle θ is used at the same position, a new angle θ and at new position is used, etc., collecting the at least one additional sheet of light that reflects off distant and near objects, and projecting the collected light onto the image sensor 103.

In an embodiment of the present disclosure, the pixel array information contained in multiple pixel cells 301 may be binned. To increase sensitivity and control detection range, the infinity row may include multiple rows. The non-infinity rows are independent to have high depth resolution for near objects.

In an embodiment of the present disclosure, the pixel cell 301 on the infinity row operates in a non-integrating logarithmic mode or an APD mode and connects to one of the TDC array, the TAC array, and the TCC array 237 to detect the time-of-flight from distant objects and operates in an integrating linear mode to detect the disparity of light reflected off near objects from the infinity row.

In an embodiment of the present disclosure, the pixel cell 301 operates in avalanche mode (e.g., Geiger mode) to detect time-of-flight of light reflected off distant objects and operates in either the Geiger mode or a linear mode to detect disparity of light reflected off near objects, and to reduce power consumption and substrate-induced interference.

In step 831, if a pixel cell 301 in the pixel array 231 concerns a distant object, the range Z to the distant object is determined by direct TOF according to Equation (1) described above and if a pixel cell 301 in the pixel array 231 concerns a near object, the range Z to the near object is determined by triangulation according to Equation (2) described above simultaneously with the determination of direct TOF. A distant object is one which is imaged on a single or a binned infinity row. The distance range is not absolutely infinity. Based on triangulation, the distance of an object which is imaged onto the row right below the infinity row may be calculated. The infinity row's range is any distance greater than an object imaged onto the row right below the infinity row. Based on the distance range, gating in time is done for the infinity row to further filter out a noise signal caused by multipath reflection, bad weather, etc. Time gating indicates that the pixels in the infinity row of the pixel array 231 are enabled with a time delay after the light source 101 is pulsed. The time delay is related to the time of flight of the minimum distance range the infinity row is able to capture. The duration of the gating signal is determined by the time-of-flight of the largest range to be measured. Time gating may also be applied to a near object. An integration time may be shorter than the TOF of the infinity row or may be the same as the duration of the light pulse. In an embodiment of the present disclosure, after integration is completed. The bright spots on each row is used to determine disparity of the reflected light and then the range of the near objects.

In step 833, TOF information recorded in one of the TDC array, the TAC array, and the TCC array 237 is cross-correlated with disparity information associated with the same sheet of light.

Figure 9A:
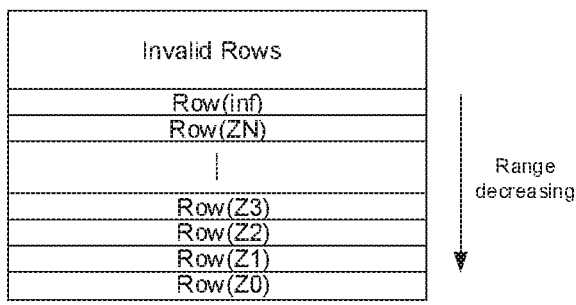
FIGS. 9A-9C are illustrations of gating and binning according to an embodiment of the present disclosure.
Figure 9B:
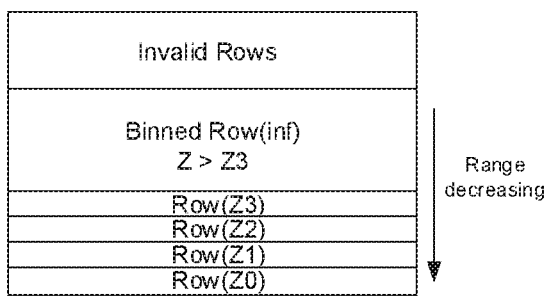
Figure 9C:
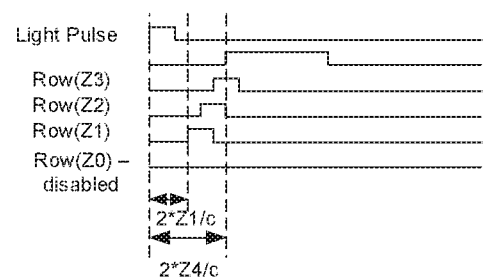

FIGS. 9A-9C are illustrations of gating and binning according to an embodiment of the present disclosure.

Referring to FIGS. 9A-9C, rows are used to divide the full range into pieces. The distance range for readout may be chosen to increase readout time. In addition, gating is done in time to eliminate noise signals caused by a scattering of bad weather or multi-reflections. Thus, gating in time is equivalent to applying shutters row-by-row, which is commonly referred to as gated imaging. Binning is used to increase sensitivity, control detection range by selecting how many rows to bin, and readout time.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A range sensor, comprising:
a light source configured to project a plurality of sheets of light at an angle within a field of view (FOV);
an image sensor, wherein the image sensor is offset from the light source and includes a pixel array including rows of pixels, a row decoder connected to the pixel array, one of a time-to-digital converter (TDC) array, a time-to-analog converter (TAC) array, and a time-to-charge converter (TCC) array connected to the pixel array, and a column decoder connected to the one of the TDC array, the TAC array, and the TCC array;
collection optics; and
a controller connected to the light source, the image sensor, and the collection optics, and configured to simultaneously determine a range of a distant object based on direct time-of-flight (TOF) and a range of a near object based on triangulation, determine the range of the distant object based on, at least in part, a path of each of the plurality of sheets of light from the light source to the distant object, and determine the range of the near object based on, at least in part, a focal length from the collection optics to the image sensor,
wherein each of the plurality of sheets of light is projected parallel to a row of pixels in the pixel array.

2. The range sensor of claim 1, wherein the image sensor is configured to reject ambient light and further comprises:
a pixel array, including an input, a first output, and a second output, wherein the pixel array includes rows of pixels, and wherein each of the plurality of sheets of light is projected parallel to a row of pixels in the pixel array;
a row decoder, including an input and an output connected to the input of the pixel array;
the time-to-digital converter (TDC) array, including a first input connected to the first output of the pixel array, a second input, a third input, and an output;
a first column decoder, including an input connected to the output of the TDC array, and an output;
an analog-to-digital converter (ADC) array, including a first input connected to the second output of the pixel array, a second input, a first output, and a second output;
a second column decoder, including an input connected to the first output of the ADC array, and an output; and
a digital block, including a first input connected to the second output of the ADC array, a second input connected to the output of the second column decoder, and an output.

3. The range sensor of claim 1, wherein the pixel array comprises n by m pixel cells arranged in columns and rows, where n and m are predetermined integers, and wherein the pixel array is one of a 2 dimensional (2D) red-green-blue (RGB) sensor, an infrared (IR) cut filter, a 2D IR sensor, a 2D near IR (NIR) sensor, a 2D red-green-blue-white (RGBW) sensor, and a 2D RGB-IR sensor.

4. The range sensor of claim 3, wherein the pixel cell comprises:
a pinned photo-diode (PPD), including an anode connected to a potential that is 0 volts or less, and a cathode, where the PPD can operate in a logarithm mode and in an avalanche pinned diode (APD) mode for light reflected off distant objects and near objects;
a first n-channel metal oxide semiconductor (NMOS) transistor, including a source terminal connected to the cathode of the PPD, a gate terminal for receiving a transfer signal (TX), and a drain terminal;
a second NMOS transistor, including a drain terminal connected to a power supply voltage, a gate terminal for receiving a reset signal (RST), and a source terminal connected to the drain terminal of the first NMOS transistor;
a third NMOS transistor, including a drain terminal connected to the power supply voltage, a gate terminal connected to the drain terminal of the first NMOS transistor, and a source terminal; and
a fourth NMOS transistor, including a drain terminal connected to the source terminal of the third NMOS transistor, a gate terminal for receiving a row select signal (RSEL), and a source terminal which is an output of the pixel cell (PIXOUT), wherein PIXOUT may be shared with another pixel cell.

5. The range sensor of claim 3, wherein the pixel cell comprises:
- a photo-diode (PD), including an anode connected to a ground potential, and a cathode, where the PD operates in avalanche mode for light reflected off distant objects and in either avalanche mode or linear mode for light reflected off near objects;
- a p-channel metal oxide semiconductor (PMOS) transistor, including a source terminal connected to a voltage supply, a gate terminal for receiving a quench voltage (Vquench), and a drain terminal connected to the cathode of the PD;
- a sensing circuit, including a first input connected to the cathode of the PD, a second input for receiving a reset signal (RST), and an output;
- a second NMOS transistor, including a drain terminal connected to the output of the sensing circuit, a gate terminal for receiving a row select signal (RSEL), and a source terminal which is an output of the pixel cell (PIXOUT).

6. The range sensor of claim 3, wherein the one of the TDC, the TAC, and the TCC is configured to record TOF information of one of a plurality of sheets of light, and wherein the controller is further configured to cross-correlate the recorded TOF information with disparity associated with the one of the plurality of sheets of light of the TOF information.

7. The range sensor of claim 1, wherein the controller is further configured to determine the range of the distant object based on, at least in part, a path of each of the plurality of sheets of light reflecting off the distant object to the image sensor, a time elapsed as each of the plurality of sheets of light travels from the light source to the distant object, and a time elapsed as each of the plurality of sheets of light travels from the distant object to the image sensor.

8. The range sensor of claim 1, wherein the controller is further configured to determine the range of the near object based on, at least in part, the offset between the light source and the image sensor, a first displacement in the image sensor, a second displacement in the image sensor, and an angle of each of the plurality of sheets of light projected from the light source, wherein the light source is further configured to project the plurality of sheets of light in a pseudo random diffraction optical elements (DOE) pattern.

9. The range sensor of claim 3, wherein the controller is further configured to select pixels cells of the pixel array to bin to increase sensitivity and control a detection range.

10. A method of a range sensor, comprising:
- projecting, by a light source, a plurality of sheets of light at an angle within a field of view (FOV);
- offsetting an image sensor from the light source, the image sensor including a pixel array including rows of pixels, a row decoder connected to the pixel array, one of a time-to-digital converter (TDC) array, a time-to-analog converter (TAC) array, and a time-to-charge converter (TCC) array connected to the pixel array, and a column decoder connected to the one of the TDC array, the TAC array, and the TCC array;
- collecting, by collection optics, the plurality of sheets of light reflected off objects;
- determining simultaneously, by a controller connected to the light source, the image sensor, and the collection optics, a range of a distant object based on direct time-of-flight and a range of a near object based on triangulation; and
- determining, by the controller, the image sensor, and the collection optics, the range of the distant object based on, at least in part, a path of each of the plurality of sheets of light from the light source to the distant object, and determining the range of the near object based on, at least in part, a focal length from the collection optics to the image sensor,
wherein each of the plurality of sheets of light is projected parallel to a row of pixels in the pixel array.

11. The method of range sensor of claim 10, wherein the image sensor is configured to reject ambient light and further comprises:
- a pixel array, including an input, a first output, and a second output, wherein the pixel array includes rows of pixels, and wherein each of the plurality of sheets of light is projected parallel to a row of pixels in the pixel array;
- a row decoder, including an input and an output connected to the input of the pixel array;
- the time-to-digital converter (TDC) array, including a first input connected to the first output of the pixel array, a second input, a third input, and an output;
- a first column decoder, including an input connected to the output of the TDC array, and an output;
- an analog-to-digital converter (ADC) array, including a first input connected to the second output of the pixel array, a second input, a first output, and a second output;
- a second column decoder, including an input connected to the first output of the ADC array, and an output; and
- a digital block, including a first input connected to the second output of the ADC array, a second input connected to the output of the second column decoder, and an output.

12. The method of the range sensor of claim 10, wherein the pixel array comprises n by m pixel cells arranged in columns and rows, where n and m are predetermined integers, and wherein the pixel array is one of a 2 dimensional (2D) red-green-blue (RGB) sensor, an infrared (IR) cut filter, a 2D IR sensor, a 2D near IR (NIR) sensor, a 2D red-green-blue-white (RGBW) sensor, and a 2D RGB-IR sensor.

13. The method of the range sensor of claim 12, wherein the pixel cell comprises:
- a pinned photo-diode (PPD), including an anode connected to a potential that is 0 volts or less, and a cathode, where the PPD can operate in a logarithm mode and in an avalanche pinned diode (APD) mode for light reflected off distant objects and near objects;
- a first n-channel metal oxide semiconductor (NMOS) transistor, including a source terminal connected to the cathode of the PPD, a gate terminal for receiving a transfer signal (TX), and a drain terminal;
- a second NMOS transistor, including a drain terminal connected to a power supply voltage, a gate terminal for receiving a reset signal (RST), and a source terminal connected to the drain terminal of the first NMOS transistor;
- a third NMOS transistor, including a drain terminal connected to the power supply voltage, a gate terminal connected to the drain terminal of the first NMOS transistor, and a source terminal; and
- a fourth NMOS transistor, including a drain terminal connected to the source terminal of the third NMOS transistor, a gate terminal for receiving a row select signal (RSEL), and a source terminal which is an output of the pixel cell (PIXOUT), wherein PIXOUT may be shared with another pixel cell.

14. The method of the range sensor of claim 12, wherein the pixel cell comprises:
- a photo-diode (PD), including an anode connected to a ground potential, and a cathode, where the PD operates in avalanche mode for light reflected off distant objects and in either avalanche mode or linear mode for light reflected off near objects;
- a p-channel metal oxide semiconductor (PMOS) transistor, including a source terminal connected to a voltage supply, a gate terminal for receiving a quench voltage (Vquench), and a drain terminal connected to the cathode of the PD;
- a sensing circuit, including a first input connected to the cathode of the PD, a second input for receiving a reset signal (RST), and an output;
- a second NMOS transistor, including a drain terminal connected to the output of the sensing circuit, a gate terminal for receiving a row select signal (RSEL), and a source terminal which is an output of the pixel cell (PIXOUT).

15. The method of the range sensor of claim 12, wherein the one of the TDC, the TAC, and the TCC is configured to record TOF information of one of a plurality of sheets of light, and wherein the controller is further configured to cross-correlate the recorded TOF information with disparity associated with the one of the plurality of sheets of light of the TOF information.

16. The method of the range sensor of claim 10, wherein the controller is further configured to determine the range of the distant object based on, at least in part, a path of each of the plurality of sheets of light reflecting off the distant object to the image sensor, a time elapsed as each of the plurality of sheets of light travels from the light source to the distant object, and a time elapsed as each of the plurality of sheets of light travels from the distant object to the image sensor.

17. The method of the range sensor of claim 10, wherein the controller is further configured to determine the range of the near object based on, at least in part, the offset between the light source and the image sensor, a first displacement in the image sensor, a second displacement in the image sensor, and an angle of each of the plurality of sheets of light projected from the light source, wherein the light source is further configured to project the plurality of sheets of light in a pseudo random diffraction optical elements (DOE) pattern, and select pixels cells of the pixel array to bin to increase sensitivity and control a detection range.

18. A range sensor, comprising:
- a light source configured to project a plurality of sheets of light at an angle within a field of view (FOV);
- an image sensor, wherein the image sensor is offset from the light source and includes a pixel array including rows of pixels, a row decoder connected to the pixel array, one of a time-to-digital converter (TDC) array, a time-to-analog converter (TAC) array, and a time-to-charge converter (TCC) array connected to the pixel array, and a column decoder connected to the one of the TDC array, the TAC array, and the TCC array;
- collection optics; and
- a controller connected to the light source, the image sensor, and the collection optics, and configured to simultaneously determine a range of a distant object based on direct time-of-flight and determine a range of a near object based on triangulation,
- wherein simultaneously determining the range of the distant object is based at least in part on a path of each of the plurality of sheets of light from the light source to the distant object and the time elapsed as each of the plurality of sheets of light travels the path,
- wherein the controller is further configured to determine the range of the distant object based on, at least in part, a path of each of the plurality of sheets of light from the light source to the distant object, and to determine the range of the near object based on, at least in part, a focal length from the collection optics to the image sensor, and
- wherein each of the plurality of sheets of light is projected parallel to a row of pixels in the pixel array.

* * * * *